United States Patent
Matsushige et al.

(10) Patent No.: US 7,719,879 B2
(45) Date of Patent: May 18, 2010

(54) SEMICONDUCTOR INTEGRATED CIRCUIT

(75) Inventors: Muneaki Matsushige, Kawasaki (JP);
Hiroyuki Satake, Kawasaki (JP);
Hiroshi Furuta, Kawasaki (JP);
Toshifumi Takahashi, Kawasaki (JP);
Hideyuki Nakamura, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 314 days.

(21) Appl. No.: 11/386,811

(22) Filed: Mar. 23, 2006

(65) Prior Publication Data
US 2006/0215441 A1 Sep. 28, 2006

(30) Foreign Application Priority Data
Mar. 23, 2005 (JP) .............................. 2005-084606

(51) Int. Cl.
*G11C 11/00* (2006.01)
(52) U.S. Cl. ................... 365/154; 365/49.11; 365/174
(58) Field of Classification Search ................ 365/174, 365/208, 205, 207, 154, 49.11
See application file for complete search history.

(56) References Cited
U.S. PATENT DOCUMENTS
5,930,163 A * 7/1999 Hara et al. .................. 365/154
6,822,300 B2 * 11/2004 Nii ............................. 257/390
2002/0126519 A1 * 9/2002 Foss ............................. 365/49
2003/0067819 A1 * 4/2003 Satomi et al. ............... 365/200
2005/0083765 A1 * 4/2005 Jeong et al. ............. 365/230.05
2005/0262293 A1 * 11/2005 Yoon .......................... 711/104

FOREIGN PATENT DOCUMENTS
JP 10-162581 6/1998
JP 11-232878 8/1999
JP 2003-115551 4/2003

OTHER PUBLICATIONS
"Circuit Techniques for Low-Power SRAM", Osada et al., The Institute of Electronics, Information and Communication Engineers, Technical Report of IEICE, Apr. 2004.

* cited by examiner

*Primary Examiner*—Vu A Le
*Assistant Examiner*—Han Yang
(74) *Attorney, Agent, or Firm*—Young & Thompson

(57) ABSTRACT

A semiconductor integrated circuit includes a word line extending along a first direction, a first and a second N-well regions, a P-well region disposed between the first and the second N-well regions, a memory cell having a first, second, third, and fourth PMOS transistors, and a first and second NMOS transistors, the first and the second PMOS transistors disposed in the first N-well region along a second direction which is different from the first direction, the first and the second NMOS transistors disposed in the P-well region, and the third and the fourth PMOS transistors disposed in the second N-well region along the second direction.

4 Claims, 6 Drawing Sheets

READ/WRITE

READ

WRITE

SEMICONDUCTOR INTEGRATED CIRCUIT

BACKGROUND OF THE INVENTION

1. Field of the Invention

The present invention relates to a semiconductor integrated circuit and particularly to a layout of CMOS type SRAM cells.

2. Description of Related Art

SRAM that configures a memory cell with six transistors can be formed in a standard semiconductor CMOS process and is widely used for system LSI and the like. A conventional SRAM memory cell is comprised of six transistors, which are two NMOS driver transistors, two NMOS transfer transistors and two PMOS load transistors.

Japanese Unexamined Patent Publication No. 2003-115551 (Satomi et al.) discloses a technique to form one each of NMOS driver transistor and NMOS transfer transistor in a first and a second P-well region. It also discloses that two PMOS load transistors are formed in one N-well region.

Meanwhile in recent years as elements become finer, soft error phenomena are reported to occur that causes an inversion of logical data stored in a memory cell due to an influence of radiation such as neutrons from cosmic radiation that reach on the ground. Moreover the influence of radiation further causes a multi-bit error in which a plurality of cells generate an error simultaneously. For this reason, a technique to address such multi-bit error is reported in for example, "Circuit Techniques for Low-Power SRAM", Osada et al., The Institute of Electronics, Information and Communication Engineers, Technical Report of IEICE, 2004-4.

Moreover in a SRAM cell, retention stability of data is quantitatively provided by a characteristic curve which is created by reversing input and output transfer characteristic curves of inverters and then superimposing the reversed curves on original curves. The larger an area bounded by the two characteristic curves, the more stable data can be retained. A size of this area is referred to as Static Noise Margin (SNM). SNM depends on input logic threshold of an inverter that constitutes SRAM. Accordingly SNM depends on current drive capability (for instance threshold voltage and size of MOSFET) of MOS transistors that constitute the SRAM cell. For example, when an ability of a transfer transistor becomes higher as compared to that of a driver transistor, a level of a bit line can be easily transmitted to a memory node. Since noise on the bit line can be also easily transmitted, it could result in a decrease of SNM, generating a bias in a stability point, and cell data being easily destroyed. For this reason, a transfer transistor is usually designed to have an inferior capability than a driver transistor.

To maintain data retention characteristic of a SRAM memory cell, drive capability of a NMOS driver transistor must be better than that of a NMOS transfer transistor. A technique described by Satomi et al. differentiates between the drive capability of a transfer transistor and that of a driver transistor by having a different implanted ion dose or gate length. Additionally in this technique, diffusion layers and electrodes are shaped in rectangle from an aspect of securing SMN and yield.

Techniques disclosed in Japanese Unexamined Patent Publication No. 10-162581 (Tei et al.) and Japanese Unexamined Patent Publication No. 11-232878 (Michael et al.) use PMOS transistors as transfer transistors. However a layout for the techniques is neither clearly identified nor does the technique include a resolution against the above soft error.

For a SRAM memory cell that induces a difference in drive capability by differentiating a gate length of a driver transistor from that of a transfer transistor as described by Satomi et al., there could be a difficulty in reducing cell area due to non-uniformity in its pattern. It could also reduce accuracy in microfabrication. As a countermeasure for the soft error in a conventional SRAM memory cell, there is a known method to have an error correction circuit from an aspect of circuit technology. There are other known methods from an aspect of process device to add extra capacity to cell node, adjust substrate impurity concentration and use a SOI substrate. However it has now been discovered that no technique has considered over both of a layout in view of processing accuracy and a reduction in charge collection of cell node diffusion layer on a radiation incidence.

SUMMARY OF THE INVENTION

According to one aspect of the present invention, there is provided A semiconductor integrated circuit includes a word line extending along a first direction, a first and a second N-well regions, a P-well region disposed between the first and the second N-well regions, a memory cell having a first, second, third, and fourth PMOS transistors, and a first and second NMOS transistors, the first and the second PMOS transistors disposed in the first N-well region along a second direction which is different from the first direction, the first and the second NMOS transistors disposed in the P-well region, and the third and the fourth PMOS transistors disposed in the second N-well region along the second direction.

According to another aspect of the present invention, there is provided a semiconductor integrated circuit that forms one memory cell from load transistors, transfer transistors and driver transistors. The semiconductor integrated circuit includes the load transistors formed in a N-well region, the transfer transistors formed in the N-well region, the driver transistors formed in a P-well region, wherein gate electrodes of the load transistor and the driver transistor extends from the N-well region to the P-well region.

According to another aspect of the present invention, there is provided a semiconductor integrated circuit includes a word line extending along a first direction, a N-well region, a memory cell including a plurality of transfer transistors and a plurality of driver transistors, a first diffusion region of at least one of the plurality of transfer transistors formed in the N-well region, and a second diffusion of at least one of the plurality of driver transistors formed in the N-well region. The second diffusion region is coupled to the first diffusion region, and the first diffusion region and the second diffusion region is arranged along a second direction.

The present invention can provide a semiconductor integrated circuit that improves soft error tolerance and enables to improve processing accuracy.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
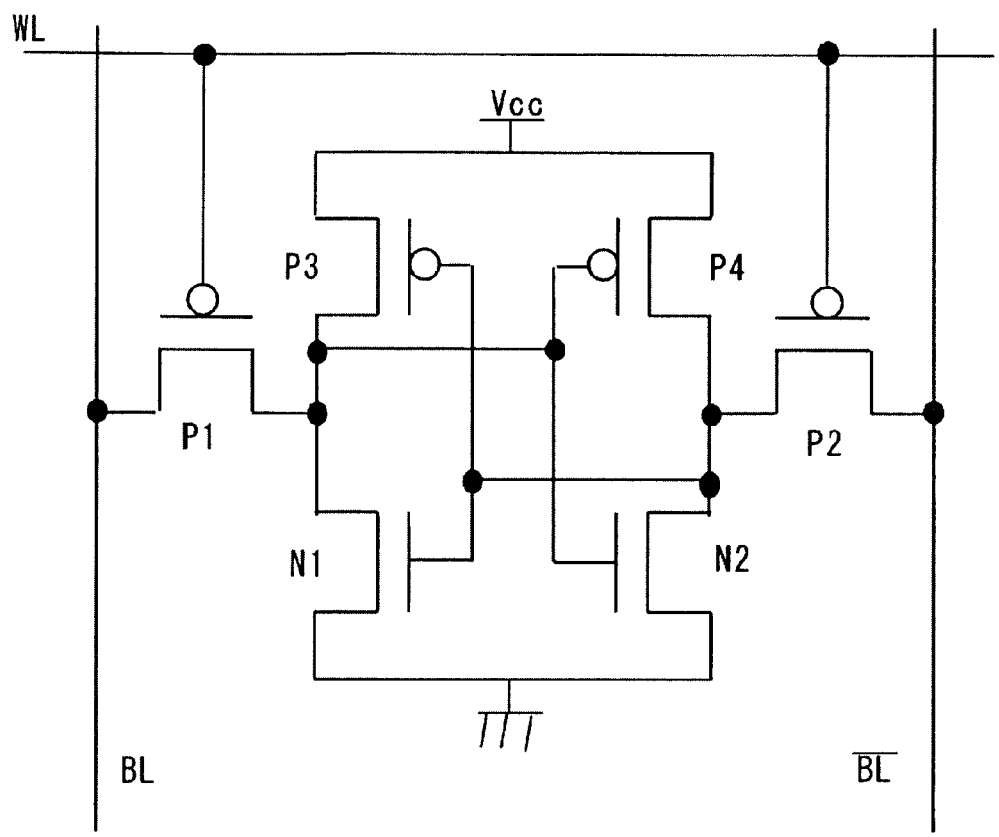
FIG. 1 is a circuit diagram showing a SRAM memory cell of the present invention.

An embodiment of the present invention is described hereinafter with reference to the drawings. FIG. 1 is a circuit diagram showing a CMOS type SRAM memory cell according to this embodiment. The SRAM memory cell of this embodiment includes NMOS driver transistors N1 and N2, PMOS transfer transistors P1 and P2, and PMOS load transistors P3 and P4.

The load transistor P3 and the driver transistor N1 are connected in series between a power supply Vcc and a ground potential GND. The load transistor P4 and the driver transistor N2 are connected in series between a power supply Vcc and a ground potential GND. The load transistor P4 and the driver transistor N2 are connected in parallel to the load transistor P3 and the driver transistor N1. Gates of the load transistor P3 and the driver transistor N1 is connected to a node in between the load transistor P4 and the driver transistor N2. Gates of the load transistor P4 and the driver transistor N2 is connected to a node in between the load transistor P3 and driver transistor N1. The transfer transistor P1 connects a bit line BL with a node in between the load transistor P3 and the driver transistor N1. A gate of the transfer transistor P1 is connected to a word line WL. The transfer transistor P2 connects a bit line BL/ with a node in between the load transistor P4 and the driver transistor N2. A gate of the transfer transistor P2 is connected to the word line WL.

Figure 2:
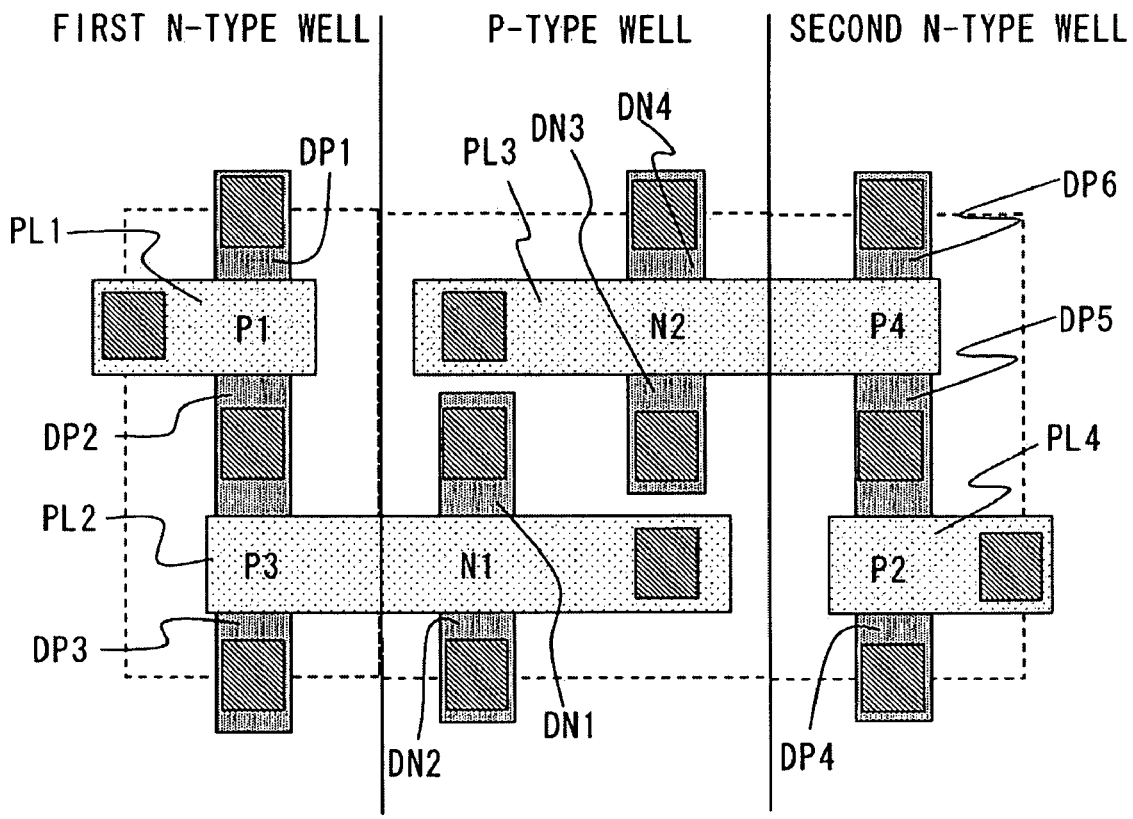
FIG. 2 is a layout diagram showing a SRAM memory cell according to an embodiment of the present invention.
Figure 3:
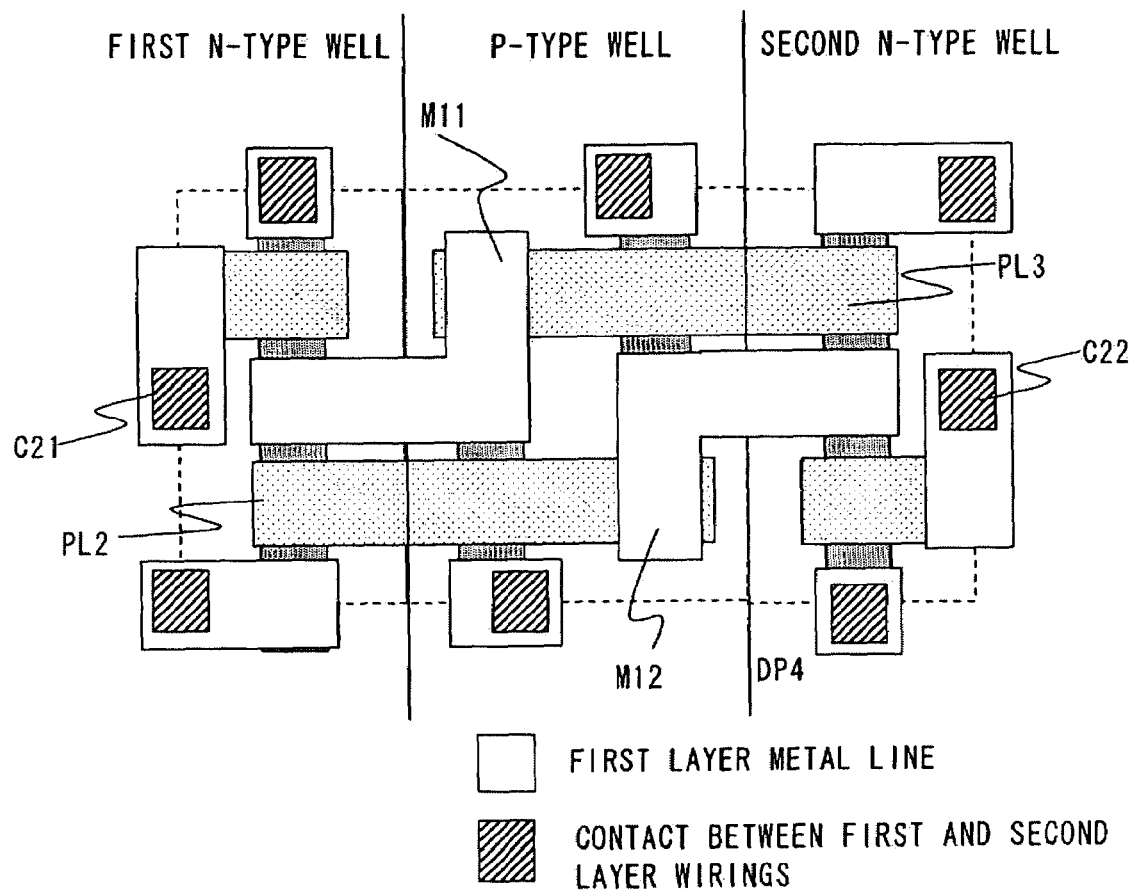
FIG. 3 is a layout diagram showing a SRAM memory cell according to an embodiment of the present invention.
Figure 4:
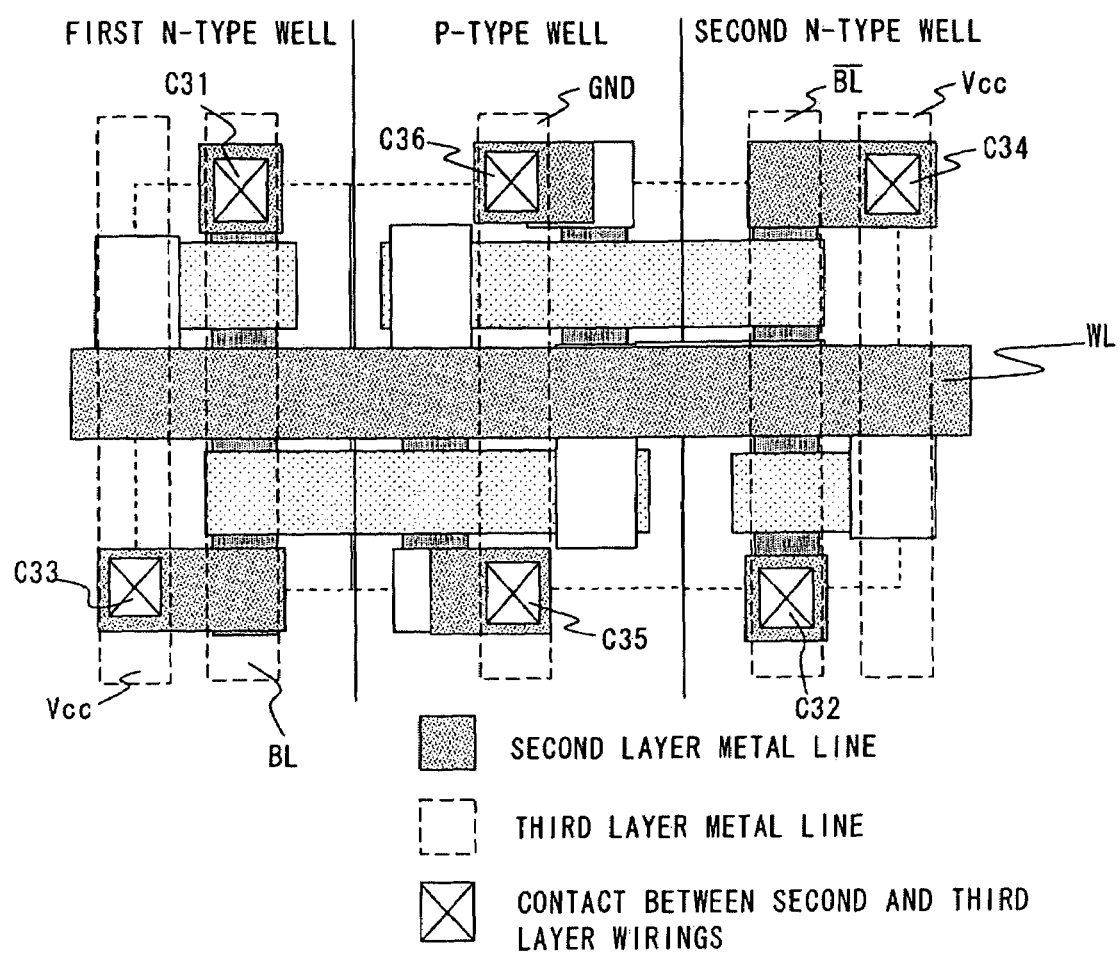
FIG. 4 is a layout diagram showing a SRAM memory cell according to an embodiment of the present invention.

A layout of the SRAM memory cell with the above configuration is described hereinafter with reference to FIGS. 2 to 4. The memory cell of this embodiment is formed by a multilayer structure with a plurality of wiring layers and contacts. FIGS. 2 to 4 are top views showing each layer in stages. A cell layout of this embodiment is described in reference to a combination of FIGS. 2 to 4.

For the SRAM memory cell of this embodiment, a first N-type well region, a second N-type well region and a P-type well region are formed in a semiconductor substrate. The well regions are formed along a direction to which a word line WL is extended (horizontal direction in FIG. 1) in order of the first N-type well region, the P-type well region, and the second N-type well region. It indicates that a single P-type well region is formed in between the two N-type well regions for one memory cell. The word line WL extends to pass over the three wells (See FIG. 4).

An arrangement of a substrate surface of this embodiment is described hereinafter in reference to FIG. 2. The SRAM memory cell of this embodiment includes polysilicon lines PL1 to PL4 and a plurality of first contacts on the substrate surface. In the first N-well region of the semiconductor substrate, rectangular-shaped P-type diffused regions DP1, DP2, and DP3 are formed. While in the P-type well region, a rectangular-shaped N-type diffused regions DN1, DN2, DN3 and DN4 are formed. Furthermore in the second N-type well region, rectangular-shaped P-type diffused regions DP4, DP5 and DP6 are formed. Polysilicon layers are gate lines that are formed over a gate insulator film on the semiconductor substrate. First contacts connect diffused regions of the semiconductor substrate or gate electrodes with first layer metal lines illustrated in FIG. 3.

The driver transistor N1 is formed by N-type diffused regions DN1, DN2 and a polysilicon layer PL2, and the driver transistor N2 is formed by N-type diffused regions DN3, DN4 and a polysilicon layer PL3. The transfer transistor P1 is formed by diffused regions DP1, DP2 and a polysilicon layer PL1, and the load transistor P3 is formed by P-type diffused regions DP2, DP3 and a polysilicon line PL2. The transfer transistor P2 is formed by diffused regions DP4, DP5 and a polysilicon layer PL4, and the load transistor P4 is formed by P-type diffused regions DP5, DP6 and a polysilicon layer PL3.

The polysilicon layer PL2 is formed extending from the first N-well region to the P-well region. The polysilicon layer PL2 is formed extending above the P-type diffused regions DP2 and DP3 to the N-type diffused regions DN1 and DN2. The polysilicon layer PL2 is a gate electrode for the load transistor P3 and the driver transistor N1 which are illustrated in FIG. 1, and it also connects gates of the load transistor P3 and the driver transistor N1. Similarly the polysilicon layer PL3 is formed extending along a word line direction, forming gates of the load transistor P4 and the driver transistor N2 (See FIG. 2).

As described above, contacts for connecting with a first layer wiring is formed on each of the diffused regions DP1 to DP6 and polysilicon layer PL1 to PL4. FIG. 3 is a top view showing metal lines in a first layer formed over the structure illustrated in FIG. 2 and also second contacts in between a first and a second layer wirings. The components illustrated in FIG. 2 are basically left out in FIG. 3, showing only a part of a lower layer and the first layer metal lines so as to depict their physical relationship.

A drain of the load transistor P3 and a drain of the driver transistor N1 are connected by a metal line M11. The metal line M11 is also connected to a gate electrode of the load transistor P4 and the driver transistor N2. A drain of the load transistor P4 and a drain of the driver transistor N2 are connected by a metal line M12. The metal line M12 is also connected to the gate electrode of the load transistor P3 and the driver transistor N1.

FIG. 4 is a top view showing the second layer wiring, a third layer wiring and contacts in between the second and the third layer wirings. The word line WL of the second layer wiring is connected to gates of the transfer transistor P1 and P2 via contacts C21, C22 and the first layer wiring that are illustrated in FIG. 3. One terminal of the transfer transistor P1 and P2 is connected to a bit line BL or BL/ via a contact C31, C32, a second layer wiring formed underneath them, a contact in between the first and the second layer, the first layer wiring and contacts to diffused regions. Furthermore sources of the load transistor P3 and P4 are connected to power supply lines Vcc via contacts C33 and C34 respectively, lines formed underneath and contacts, which are illustrated in FIG. 4. Sources of the driver transistor N1 and N2 are connected to a ground line GND via contacts C35 and C36 respectively, lines formed underneath and contacts.

As described so far, the SRAM memory of this embodiment has a configuration in which its wells extend along a bit line direction and load transistors and transfer transistors are formed in N-wells. Moreover the structure in which a first and a second N-wells are formed both side of a P-well facilitates microfabrication.

Figure 5A:
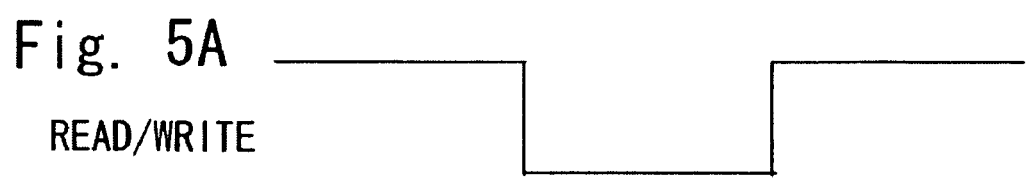
FIGS. 5A to 5E are views showing cell driving signals according to an embodiment of the present invention.
Figure 5B:
Figure 5C:
Figure 5D:
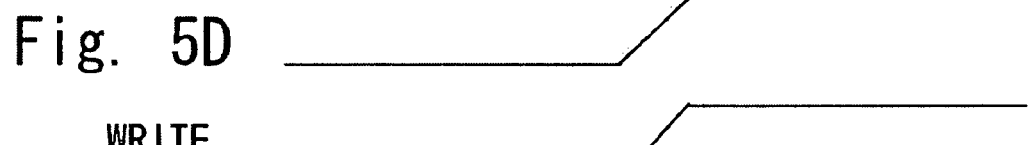
Figure 5E:

FIGS. 5A to 5E show signals to a word line WL and a bit line BL in a case of using the SRAM memory cell of the embodiment. In this embodiment, since PMOS transistors are used as transfer transistor, when a word line WL is selected, a level of the word line falls down at both of reading and writing. After that when reading, a potential difference occurs between a pair of bit lines based on data stored in a memory cell (See FIG. 5B). The potential difference is amplified by a sense amplifier which is not included in figures and outputted to a subsequent circuit as data stored in the memory cell (See FIG. 5C). At writing, as shown in FIG. 5E, a bit line is set to be a specified potential according to an address to write and data is written as shown in FIG. 5D.

As shown in FIGS. 5A to 5E, this embodiment uses PMOS transistors as transfer transistors, thus operations will be conducted with inversion of positive and negative polarities comparing with NMOS transistors as transfer transistors.

Furthermore according to experiments conducted by the inventors, it is revealed that a multi-bit error does not necessarily occur on cells in the same well but depends on an initial data of the cells. Therefore merely forming wells in an inconsecutive manner along a word line direction, as described by Osada et al., is inadequate for reduction of a multi-bit error. Hence reducing soft error in individual cells is also significant to prevent multi-bit error. This embodiment provides a consideration over well arrangement as well as an improvement in soft error tolerance of individual cells.

According to this embodiment, PMOS transistors are used as transfer transistor in configuration for reducing soft error occurrence rate of individual cells. This configuration reduces charge collection volume in cell node diffusion layer of electrons and holes that are generated in a substrate due to radiation. This is because a mobility of holes collected in node diffusion layers of PMOS transistors is generally lower than that of electrons collected in node diffusion layers of NMOS transistors, accordingly an amount of charge collected to be low.

As described above, this embodiment not only reduces an influence of radiation by configuring PMOS transistors as transfer transistor but also configures a pair of load transistor and transfer transistor to be formed in the same N-well. Accordingly in this embodiment, channel widths for the transfer transistor P1 and P2, and the load transistor P3 and P4 are the same. Furthermore channel lengths for the transfer transistor P1, P2 and the load transistor P3, P4 are also the same. Having a constant channel width enables to layout the P-type diffused regions DP1, DP2 and DP3 in a straight line with no bend. Consequently no variation in transistor width occurs due to curved shape occurs, thus preventing from variations in characteristic of PMOS transistors.

By forming the load transistor P3, P4 and the driver transistor N1, N2 with the same channel length, mask pattern can be simple at a microfabrication process and also improves processing accuracy.

A conventional SRAM memory cell uses NMOS transistors as transfer transistor and a process is required such as to change a channel length in order to make a difference in current drive capability of driver transistor. On the other hand in this embodiment, PMOS transistors are used as transfer transistor. When a NMOS and PMOS transistor with the same size are formed, a drive capability of the PMOS transistor is inferior to that of the NMOS transistor. Thus a drive capability of the PMOS transistors P1 and P2 is inferior than that of the NMOS driver transistors N1 and N2, whose sizes are the same as the transfer transistors, accordingly maintaining memory data stably even without having to process channel length and such.

Figure 6A:
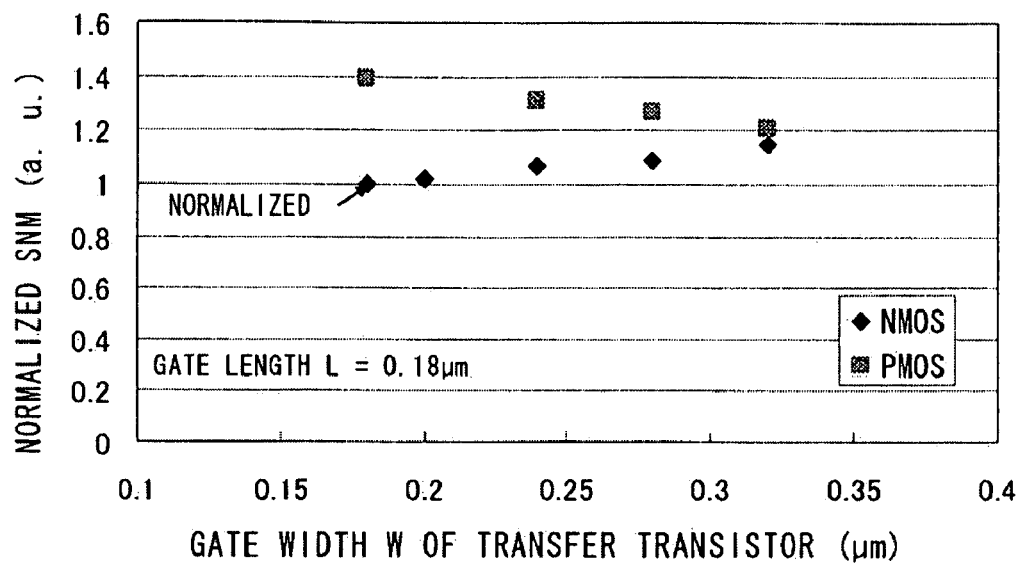
FIGS. 6A and 6B are views showing SNMs according to an embodiment of the present invention.
Figure 6B:
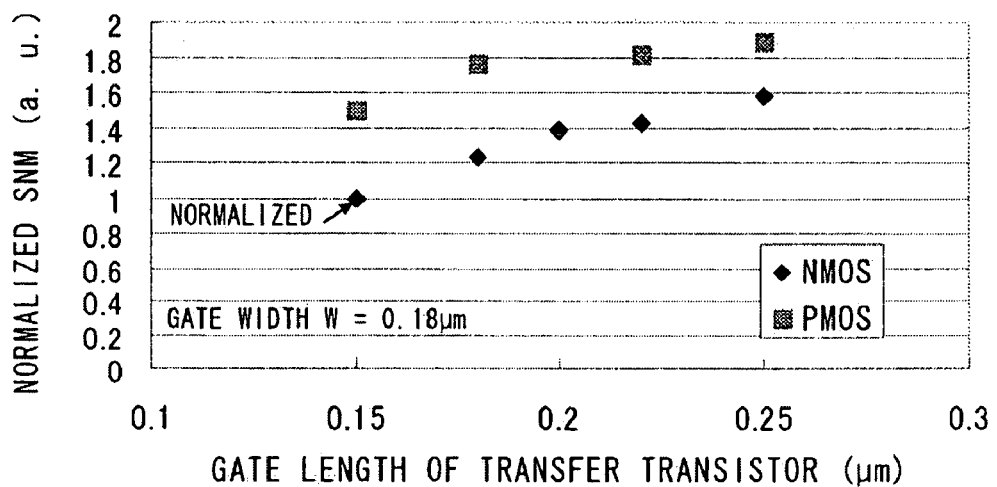

FIGS. 6A and 6B are results of calculation for Static Noise Margin (SNM) when using PMOS transistors as transfer transistor according to this embodiment along with SNM when using conventional NMOS transistors. FIG. 6A shows SNM for different gate widths W of a transfer transistor. In FIG. 6A, SNM of NMOS transistors used as transfer transistor is normalized to be 1 at a gate width W=0.18 µm (indicated as "Normalized" in FIG. 6A). FIG. 6B shows SNM for different gate length L of a transfer transistor. In FIG. 6B, SNM of NMOS transistors used as transfer transistor is normalized to be 1 at a gate length L=0.18 µm.

As illustrated in FIGS. 6A and 6B, SNM shows better values when using PMOS transistors as transfer transistor. It indicates that there is more flexibility in a design of transistor size (such as gate length L and gate width W), if using PMOS transistors as transfer transistor. In other words, it is possible for a load PMOS transistor (with gate length L and gate width W), a transfer PMOS transistor and a driver NMOS transistor to have the same size as appropriate. Having the same width for diffusion layers (gate width) and gate electrode layers (gate length) leads to an improvement of processing accuracy.

According to this embodiment, forming transfer transistor with PMOS transistors reduces soft error caused by radiation from outer space, as well as a probability of multi-bit error occurrence. Moreover, by placing load transistors and transfer transistors to align along a bit line direction in the first and the second N-well regions respectively, gate widths and gate lengths of the load and the transfer transistors can be the same, consequently improving processing accuracy. Because of the arrangement in which the first N-well, the P-well and the second N-well are placed adjacent to a word line direction and each well is formed to extend along a bit line direction, the wells extending along a word line direction will not cause a multi-bit error. By using PMOS transistors as transfer transistor in a configuration, there is no need to change sizes of the transfer transistors and the driver transistors in order to switch their drive capabilities as in a conventional SRAM cell, accordingly not complicating a manufacturing process. Furthermore an improvement in data retention characteristic can be expected by using PMOS transistors as transfer transistor.

In this embodiment, although an improvement in soft error tolerance is attempted by a transistor configuration and layout of a SRAM cell, techniques such as adding additional capacity to cell nodes and optimizing substrate impurity concentration may be combined with techniques of this invention.

It is apparent that the present invention is not limited to the above embodiment and it may be modified and changed without departing from the scope and spirit of the invention.

What is claimed is:

1. A semiconductor integrated circuit that forms a memory cell from load transistors, transfer transistors and driver transistors comprising:
   the load transistors formed in a N-well region;
   the transfer transistors formed in the N-well region;
   the driver transistors formed in a single P-well region dividing the N-well region, wherein gate electrodes of the load transistors and the driver transistors extend from the N-well region to the P-well region,
   a word line elongating in a first direction traversing and perpendicular to a second direction defining parallel to a N-well to P-well boundary direction.

2. The semiconductor integrated circuit according to claim 1, wherein lines to provide the N-well and P-well regions with potential are placed along a direction orthogonal to the first direction to which a word line is extended.

3. The semiconductor integrated circuit according to claim 1, wherein gate widths and gate lengths of the load transistors and the transfer transistors are practically the same.

4. The semiconductor integrated circuit according to claim 2, wherein gate widths and gate lengths of the load transistors and the transfer transistors are practically the same.

* * * * *